(12) United States Patent
Shin et al.

(10) Patent No.: US 7,576,581 B2
(45) Date of Patent: Aug. 18, 2009

(54) CIRCUIT AND METHOD FOR CORRECTING DUTY CYCLE

(75) Inventors: Dong Suk Shin, Ichon (KR); Hyun Woo Lee, Ichon (KR); Won Joo Yun, Ichon (KR)

(73) Assignee: Hynix Semiconductor Inc. (KR)

( * ) Notice: Subject to any disclaimer, the term of this patent is extended or adjusted under 35 U.S.C. 154(b) by 46 days.

(21) Appl. No.: 11/961,931

(22) Filed: Dec. 20, 2007

(65) Prior Publication Data
US 2008/0252350 A1     Oct. 16, 2008

(30) Foreign Application Priority Data
Apr. 12, 2007     (KR)     ...................... 10-2007-0035824

(51) Int. Cl.
*H03K 5/04*     (2006.01)
(52) U.S. Cl. ........................ 327/175; 327/170; 327/171
(58) Field of Classification Search ................. 327/153, 327/158, 159, 161, 170, 172–176, 291, 294, 327/299
See application file for complete search history.

(56) References Cited

U.S. PATENT DOCUMENTS

| 6,853,225 | B2 | 2/2005 | Lee |
| 6,859,081 | B2 | 2/2005 | Hong et al. |
| 6,963,235 | B2 | 11/2005 | Lee |
| 7,078,949 | B2 * | 7/2006 | Kim et al. ................... 327/158 |
| 2004/0066873 | A1 | 4/2004 | Cho et al. |
| 2006/0197565 | A1 | 9/2006 | Kang |

FOREIGN PATENT DOCUMENTS

JP     2004-129255     4/2004

* cited by examiner

*Primary Examiner*—An T Luu
(74) *Attorney, Agent, or Firm*—Baker & McKenzie LLP

(57) ABSTRACT

A circuit for correcting a duty cycle includes a duty ratio digital conversion block configured to output duty ratio information of an input clock signal as plural-bit digital signals, a duty ratio information analyzing block configured to analyze the duty ratio information of the input clock signal, generate edge control signals, and select any one of a plurality of delayed clock signals, and a duty ratio control block configured to control duty ratios of a selected delayed clock signal and the input clock signal in response to the edge control signals.

25 Claims, 7 Drawing Sheets

CIRCUIT AND METHOD FOR CORRECTING DUTY CYCLE

CROSS-REFERENCES TO RELATED APPLICATION

This application claims the benefit under 35 U.S.C. 119(a) of Korean Patent Application number 10-2007-0035824, filed on Apr. 12, 2007, in the Korean Intellectual Property Office, the contents of which are incorporated herein by reference in its entirety as if set forth in full.

BACKGROUND

1. Technical Field

The disclosure relates to a circuit and a method for correcting a duty cycle, and more particularly, to a circuit and a method for correcting a duty cycle, which can precisely correct the duty cycle of a clock signal.

2. Related Art

In general, in a semiconductor integrated circuit such as a DDR SDRAM (Double Data Rate Synchronous Dynamic Random Access Memory), data is processed by using both the rising edge and the falling edge of a clock signal to increase an operation speed. Therefore, if the ratio between the high level pulse width and the low level pulse width of a clock signal, that is, a duty ratio does not correspond to 50:50, operation efficiency is lowered. However, in substance, the clock signal generally employed in a semiconductor integrated circuit makes it difficult to have a precise duty ratio due to various factors related to how the semiconductor integrated circuit is mounted, such as noise, etc. Thus, in order to improve operation efficiency, the semiconductor integrated circuit is provided with a duty cycle correction circuit for correcting the duty ratio of a clock signal.

However, conventional duty cycle correction circuits, such as digital converter types and phase mixer types, suffer in their ability to correct the duty cycle and in that conventional duty cycle correction circuits have a large amount of power consumption, which is not sufficient to support the high performance operation of semiconductor integrated circuits.

SUMMARY

A circuit and a method for precisely correcting the duty cycle of a clock signal is disclosed herein.

According to one aspect, a circuit configured to correct a duty cycle can include a duty ratio digital conversion block configured to output duty ratio information of an input clock signal as plural-bit digital signals, a duty ratio information analyzing block configured to analyze the duty ratio information of the input clock signal, generate edge control signals, and select any one of a plurality of delayed clock signals, and a duty ratio control block configured to control duty ratios of a selected delayed clock signal and the input clock signal in response to the edge control signals.

According to another aspect, a circuit configured to correct a duty cycle can comprise a duty ratio detection unit configured to detect a duty ratio of an input clock signal and generate duty detection signals, which contain length information of a high duration and length information of a low duration of the input clock signal, a signal analyzing unit configured to analyze the duty detection signals and generate first and second edge control signals, an edge control unit configured to generate a falling clock signal by controlling an edge of a clock signal that is delayed by a specified delay amount from the input clock signal and a rising clock signal by controlling an edge of the input clock signal in response to the first and second edge control signals, and a phase mixing unit configured to mix phases of the falling clock signal and the rising clock signal and generate an output clock signal.

Each phase comparator comprises a first XNR gate for receiving the comparison control signal and the previously allocated delayed clock signal; a second XNR gate for receiving the comparison control signal and the input clock signal; and a flip-flop for latching an output signal of the first XNR gate in response to an output signal of the second XNR gate and outputting it as the phase comparison signal. The signal combining section includes a plurality of signal combiners each of which combines adjoining two of the plurality of phase comparison signals and generates a corresponding duty detection signal.

According to still another aspect, a circuit configured to correct a duty cycle can comprise a clock dividing unit configured to delay an input clock signal by a specified delay amount and generate a plurality of delayed clock signals, a clock selection unit configured to output any one among the plurality of delayed clock signals as a selected delayed clock signal in response to duty ratio information of the input clock signal, an edge control unit configured to generate a falling clock signal by controlling a falling edge of the selected delayed clock signal and to generate a rising clock signal by controlling a falling edge of the input clock signal based on information regarding a difference between lengths of a high duration and a low duration of the input clock signal, and a phase mixing unit for mixing phases of the falling clock signal and the rising clock signal and generating an output clock signal.

The clock dividing unit comprises a plurality of unit delays which sequentially delay the input clock signal in response to the respective delay enable signals and generate the plurality of delayed clock signals.

The clock selection unit comprises: a first decoder for decoding the duty ratio information of the input clock signal and generating selection decoding signals; and a clock selection section for outputting any one among the plurality of delayed clock signals as the selected delayed clock signal, in response to the selection decoding signals.

A duty ratio detection unit for comparing phases of the input clock signal and the respective delayed clock signals in response to a comparison control signal and generating plural-bit duty detection signals. The duty ratio detection unit comprises: a phase comparison section for comparing phases of the input clock signal and the plurality of delayed clock signals in response to the comparison control signal and generating a plurality of phase comparison signals; a signal combining section for combining the plurality of phase comparison signals and generating the plural-bit duty detection signals. The phase comparison section includes a plurality of phase comparators each of which extracts the same phase duration of the input clock signal and a previously allocated delayed clock signal among the plurality of delayed clock signals in response to the comparison control signal and generates a corresponding phase comparison signal.

The signal combining section includes a plurality of signal combiners each of which combines adjoining two of the plurality of phase comparison signals and generates a corresponding duty detection signal. A signal analyzing unit for generating the plural-bit delay enable signals, plural-bit clock selection signals containing the duty ratio information of the input clock signal, and edge control signals containing the information regarding the difference between the lengths of the high duration and the low duration of the input clock signal, from the plural-bit duty detection signals in response to a high duration signal and a low duration signal.

The signal analyzing unit comprises: an encoder for encoding the plural-bit duty detection signals and generating plural-bit encoding signals; a first latch for latching the plural-bit encoding signals in response to the high duration signal and outputting plural-bit first latch signals; a second latch for latching the plural-bit encoding signals in response to the low duration signal and outputting the plural-bit clock selection signals; a logic comparator for comparing logic values of the plural-bit first latch signals and the plural-bit clock selection signals and generating a logic determination signal; a multiplexer for extracting signals having greater logic values between the first latch signals and the clock selection signals, in response to the logic determination signal; a second decoder for decoding signals transmitted from the multiplexer and outputting the plural-bit delay enable signals; an operator for implementing operation for obtaining logic differences between the first latch signals and the clock selection signals in response to the logic determination signal and generating operation signals; and a third decoder for decoding the operation signals and generating the edge control signals. A control signal generation unit for generating the comparison control signal by frequency-dividing the input clock signal and for generating the high duration signal and the low duration signal by determining the high duration and the low duration of the input clock signal.

The control signal generation unit comprises: a comparison control section for frequency-dividing by a predetermined number the input clock signal and generating the comparison control signal; and an duration signal generation section for generating the high duration signal which is enabled during the high duration of the input clock signal and the low duration signal which is enabled during the low duration of the input clock signal.

The edge control signals include first edge control signals and second edge control signals, and the edge control unit comprises: a first edge control unit for generating the falling clock signal by controlling the falling edge of the selected delayed clock signal in response to the first edge control signals; and a second edge control unit for generating the rising clock signal by controlling the falling edge of the input clock signal in response to the second edge control signals.

The first edge control unit comprises: a first pull-up section for pulling up a first driving section in response to the first edge control signals; a first pull-down section for pulling down the first driving section in response to an externally supplied voltage; the first driving section for receiving the selected delayed clock signal and responding to pull-up operation of the first pull-up section and pull-down operation of the first pull-down section; a second pull-up section for pulling up a second driving section in response to a ground voltage; a second pull-down section for pulling down the second driving section in response to the first edge control signals; and the second driving section for receiving an output signal of the first driving section, responding to pull-up operation of the second pull-up section and pull-down operation of the second pull-down section, and outputting the falling clock signal.

The second edge control unit comprises: a first pull-up section for pulling up a first driving section in response to the second edge control signals; a first pull-down section for pulling down the first driving section in response to an externally supplied voltage; the first driving section for receiving the input clock signal and responding to pull-up operation of the first pull-up section and pull-down operation of the first pull-down section; a second pull-up section for pulling up a second driving section in response to a ground voltage; a second pull-down section for pulling down the second driving section in response to the second edge control signals; and the second driving section for receiving an output signal of the first driving section, responding to pull-up operation of the second pull-up section and pull-down operation of the second pull-down section, and outputting the rising clock signal.

According to a still further aspect, a method for correcting a duty cycle can comprise the steps of delaying an input clock signal by a specified delay amount and generating a plurality of delayed clock signals, comparing phases of the input clock signal and the respective delayed clock signals and converting duty ratio information of the input clock signal into plural-bit digital signals, analyzing the duty ratio information of the input clock signal and generating clock selection signals and edge control signals, selecting any one among the plurality of delayed clock signals in response to the clock selection signals, and controlling duty ratios of the selected delayed clock signal and the input clock signal in response to the edge control signals.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
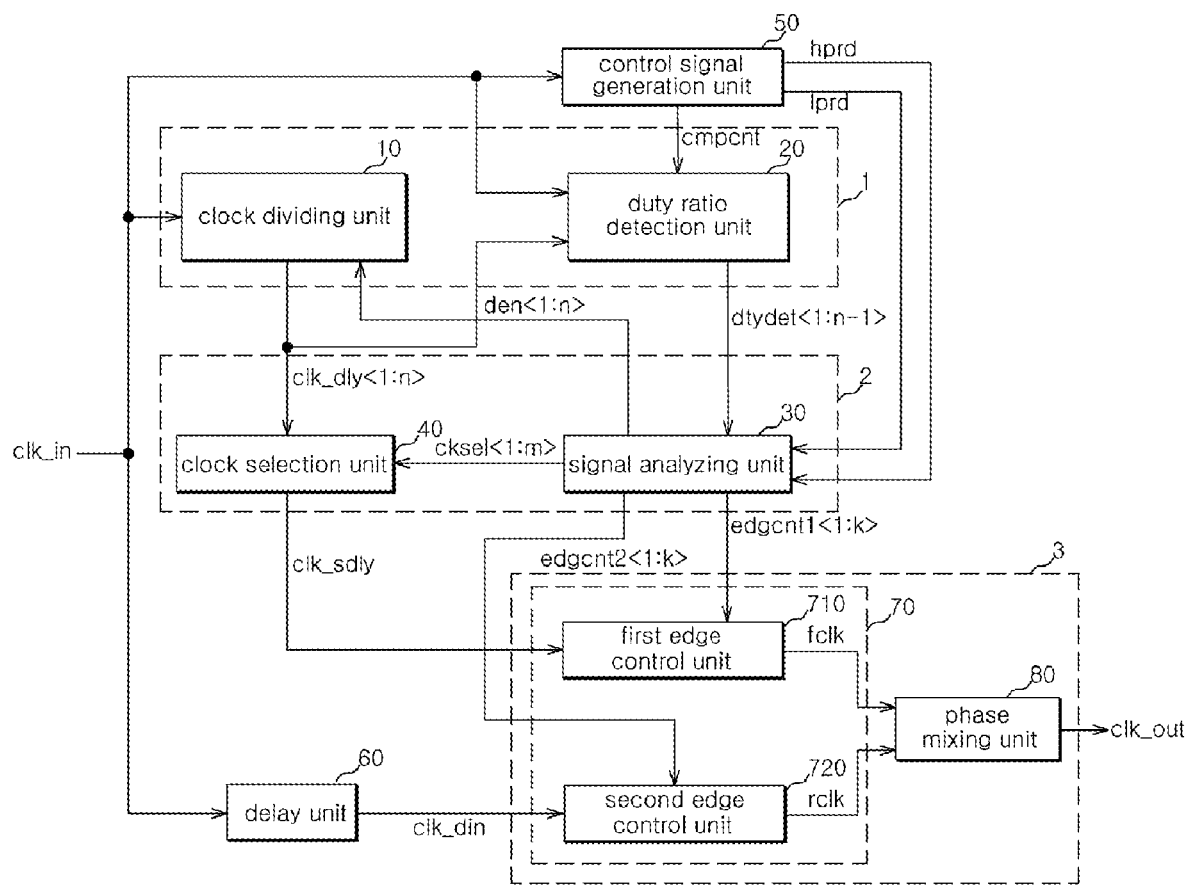
FIG. 1 is a block diagram illustrating an example duty cycle correction circuit in accordance with one embodiment.

Wherever possible, the same reference numerals will be used throughout the drawings and the description to refer to the same or like parts.

FIG. 1 is a block diagram illustrating the configuration of a duty cycle correction circuit 11 in accordance with one embodiment. Referring to FIG. 1, the duty cycle correction circuit 11 can include a digital conversion block 1, a duty ratio information analyzing block 2, a control signal generation unit 50, a delay unit 60, and a duty ratio control block 3.

First, the digital conversion block 1 can include a clock dividing unit 10 and a duty ratio detection unit 20. Also, the duty ratio information analyzing block 2 can include a signal analyzing unit 30 and a clock selection unit 40, and the duty ratio control block 3 can include an edge control unit 70 and a phase mixing unit 80.

The clock dividing unit 10 can be configured to delay an input clock signal (clk_in) by a specified delay amount in response to n delay enable signals (den<1:n>), and generate n delayed clock signals (clk_dly<1:n>).

The duty ratio detection unit 20 can compare the phases of the input clock signal (clk_in) and the respective n delayed clock signals (clk_dly<1:n>) in response to a comparison control signal (cmpcnt), and generate duty detection signals (dtydet<1:n−1>) of n−1 bit(s).

The signal analyzing unit 30 can generate the n delay enable signals (den<1:n>), clock selection signals (cksel<1:m>) of m-bit and first and second edge control signals (edgcnt1<1:k>) and (edgcnt2<1:k>) from the n−1 bit duty detection signals (dtydet<1:n−1>) in response to a high duration signal (hprd) and a low duration signal (lprd).

The clock selection unit 40 can output any one among the n delayed clock signals (clk_dly<1:n>) as a selected delayed clock signal (clk_sdly) in response to the clock selection signals (cksel<1:m>) of m-bit.

The control signal generation unit 50 can generate the comparison control signal (cmpcnt) by frequency-dividing the input clock signal (clk_in), and generate the high duration signal (hprd) and the low duration signal (lprd) by detecting the high duration and the low duration of the input clock signal (clk_in).

The delay unit 60 can delay the input clock signal (clk_in) for a specified time, and output a delayed input clock signal (clk_din).

The edge control unit 70 can generate a falling clock signal (fclk) by controlling the falling edge timing of the selected delayed clock signal (clk_sdly) in response to the first edge control signals (edgcnt1<1:k>), and generate a rising clock signal (rclk) by controlling the falling edge timing of the delayed input clock signal (clk_din) in response to the second edge control signals (edgcnt2<1:k>).

The phase mixing unit 80 can mix the phases of the rising clock signal (rclk) and the falling clock signal (fclk), and generate an output clock signal (clk_out).

The input clock signal (clk_in) may be a clock signal or a data output clock signal, which can be generated from a DLL (delay-locked loop) circuit in a semiconductor integrated circuit, and is not limited to a specific clock signal. That is, the input clock signal (clk_in) is a common name of the clock signal, which can be input into the duty cycle correction circuit for the correction of a duty cycle.

The edge control unit 70 can include a first edge control unit 710 and a second edge control unit 720.

The first edge control unit 710 can generate the falling clock signal (fclk) by controlling the falling edge of the selected delayed clock signal (clk_sdly) in response to the first edge control signals (edgcnt1<1:k>).

The second edge control unit 720 can generate the rising clock signal (rclk) by controlling the falling edge of the delayed input clock signal (clk_din) in response to the second edge control signals (edgcnt2<1:k>).

The delay unit 60 is configured to control the timing at which the input clock signal (clk_in) is inputted to the second edge control unit 720. That is, until the selected delayed clock signal (clk_sdly) is inputted to the first edge control unit 710, a predetermined time, during which the operation of the clock dividing unit 10 and the operation of the clock selection unit 40 are implemented, is required. For this reason, the timing, at which the input clock signal (clk_in) is inputted to the second edge control unit 720, can be controlled by the delay unit 60. While the delayed input clock signal (clk_din) is a clock signal, which can have a specified delay time with respect to the input clock signal (clk_in), when considering the generation of a slight error, the input clock signal (clk_in) can be inputted and function in place of the delayed input clock signal (clk_din).

Figure 2:
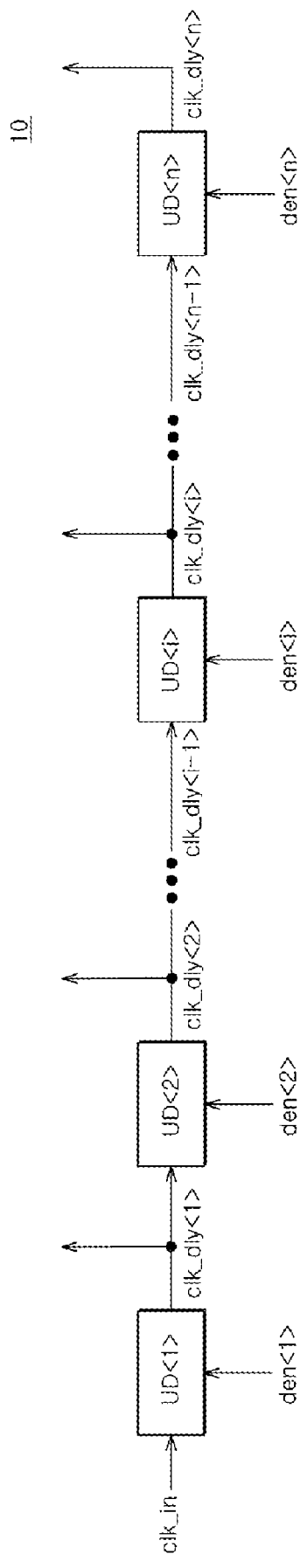
FIG. 2 is a block diagram of a clock dividing unit that can be included in the circuit illustrated in FIG. 1.

FIG. 2 is a block diagram of a clock dividing unit that can be included in the circuit illustrated in FIG. 1. Referring to FIG. 2, the clock dividing unit 10 can include n unit delays UD<1:n>, which sequentially delay the input clock signal (clk_in) in response to the respective delay enable signals (den<1:n>), and generate n delayed clock signals (clk_dly<1:n>).

The n delayed clock signals (clk_dly<1:n>) can be clock signals, which have a phase difference obtained by n dividing one period of the input clock signal (clk_in). In an initial operational stage of the duty cycle correction circuit, all the n delay enabled signals (den<1:n>) can be enabled. However, after the duty ratio detection unit 20 detects the length information of the high duration and the low duration of the input clock signal (clk_in), only some of the n delay enable signals (den<1:n>) are enabled by the rate of the long duration between the high duration and the low duration of the input clock signal (clk_in). For example, assuming that n is 10, if the ratio between the high duration and the low duration of the input clock signal (clk_in) is 6:4, only six among the n delay enable signals (den<1:n>) are enabled. Accordingly, the remaining unit delays are interrupted in their operations, whereby power consumption can be reduced.

Figure 3:
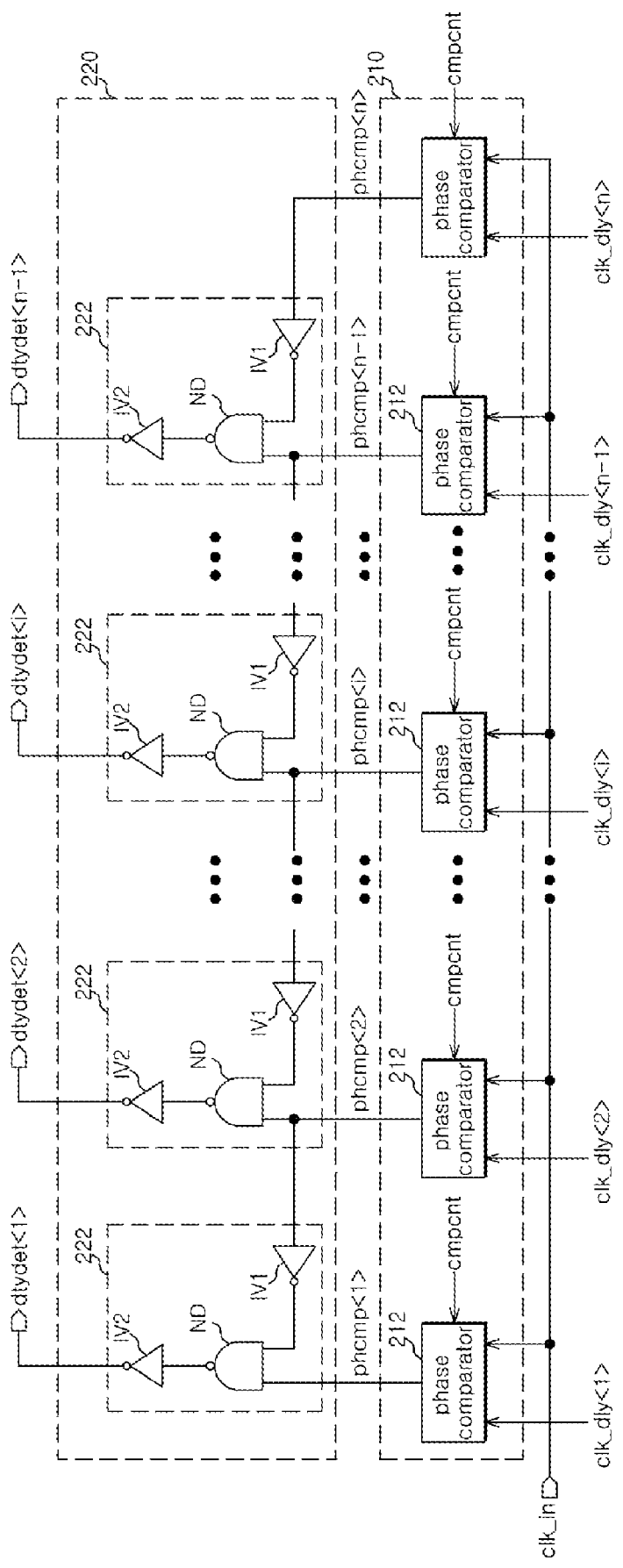
FIG. 3 is a block diagram of a duty ratio detection unit that can be included in the circuit illustrated in FIG. 1.

FIG. 3 is a block diagram of a duty ratio detection unit that can be included in the circuit illustrated in FIG. 1. Referring to FIG. 3, the duty ratio detection unit 20 can include a phase comparison section 210 and a signal combining section 220.

The phase comparison section 210 can compare the phases of the input clock signal (clk_in) and the n delayed clock signals (clk_dly<1:n>) in response to the comparison control signal (cmpcnt), and generate n phase comparison signals (phcmp<1:n>).

The signal combining section 220 can combine the n of phase comparison signals (phcmp<1:n>), and generate n−1 bit duty detection signals (dtydet<1:n−1>).

The phase comparison section 210 can include n phase comparators 212 each of which can extract the same phase duration of the input clock signal (clk_in) and a corresponding delayed clock signal (clk_dly<i>) in response to the comparison control signal (cmpcnt) and generate a corresponding phase comparison signal (phcmp<i>).

Also, the signal combining section 220 can include n−1 signal combiners 222 each of which can combine adjoining two n phase comparison signals (phcmp<1:n>) and generate a corresponding duty detection signal (dtydet<i>).

Each signal combiner 222 can comprise a first inverter IV1 for inverting the phase comparison signal (phcmp<i+1>) of the next stage, a NAND gate ND for receiving the output signal of the first inverter IV1 and the corresponding phase comparison signal (phcmp<i>), and a second inverter IV2 for receiving the output signal of the NAND gate ND and outputting the corresponding duty detection signal (dtydet<i>).

If the phases of the input clock signal (clk_in) and the corresponding delayed clock signal (clk_dly<i>) are the same, the phase comparator 212 can output the phase comparison signal (phcmp<i>) at a high level. Conversely, if the phases of the input clock signal (clk_in) and the corresponding delayed clock signal (clk_dly<i>) are not matched, the phase comparator 212 can output the phase comparison signal (phcmp<i>) at a low level. The comparison control signal (cmpcnt) is a signal, which can be generated by frequency-dividing by a predetermined number (for example, 2) the input clock signal (clk_in). Under the control of the comparison control signal (cmpcnt), the n phase comparison signals (phcmp<1:*n*>) can contain the length information of the high duration and the low duration of the input clock signal (clk_in).

For example, assuming that n is 10, if the ratio between the high duration and the low duration of the input clock signal (clk_in) is 6:4, when the comparison control signal (cmpcnt) has a high level, six of ten phase comparators 212 output phase comparison signals (phcmp<1:6>) of a high level, and four of the ten phase comparators 212 output phase comparison signals (phcmp<7:10>) of a low level. Then, when the comparison control signal (cmpcnt) has a low level, four of the ten phase comparators 212 output phase comparison signals (phcmp<1:4>) of a high level, and six of the ten phase comparators 212 output phase comparison signals (phcmp<5:10>) of a low level.

When six phase comparison signals (phcmp<1:6>) of a high level and four phase comparison signals (phcmp<7:10>) of a low level are inputted to the signal combining section 220, the signal combining section 220 makes the sixth duty detection signal (dtydet<6>) to have a high level and the remaining duty detection signals (dtydet<1:5>) and (dtydet<7:9>) to have a low level. On the contrary, when four phase comparison signals (phcmp<1:4>) of a high level and six phase comparison signals (phcmp<5:10>) of a low level are inputted to the signal combining section 220, the signal combining section 220 can make the fourth duty detection signal (dtydet<4>) have a high level and the remaining duty detection signals (dtydet<1:3>) and (dtydet<5:10>) have a low level. Therefore, the n−1 duty detection signals (dtydet<1:*n*−1>) can indicate the respective length information of the high duration and the low duration of the input clock signal (clk_in) based on which signal has the potential of a high level.

Figure 4:
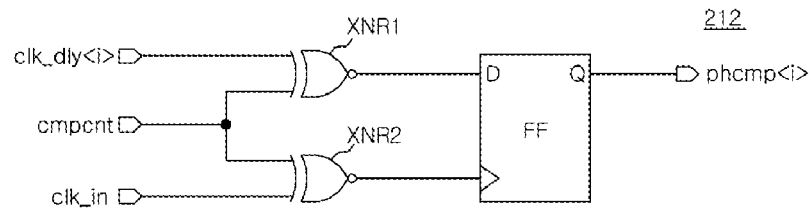
FIG. 4 is a block diagram of a phase comparator that can be included in the unit illustrated in FIG. 3.

FIG. 4 is a block diagram of a phase comparator that can be included in the circuit illustrated in FIG. 3. Referring to FIG. 4, the phase comparator 212 can include a first XNR gate XNR1, a second XNR gate XNR2 and a flip-flop FF.

The first XNR gate XNR1 can be inputted with the comparison control signal (cmpcnt) and the corresponding delayed clock signal (clk_dly<i>), and the second XNR gate XNR2 can be inputted with the comparison control signal (cmpcnt) and the input clock signal (clk_in). The flip-flop FF can latch the output signal of the first XNR gate XNR1 in response to the output signal of the second XNR gate XNR2, and output it as the corresponding phase comparison signal (phcmp<i>).

Hence, if the comparison control signal (cmpcnt) has a high level, since a signal having a high level is output from the second XNR gate XNR2 when the input clock signal (clk_in) has a high level, the flip-flop FF implements the operation for latching the output signal of the first XNR gate XNR1. At this time, if the delayed clock signal (clk_dly<i>) has a high level, the flip-flop FF outputs the phase comparison signal (phcmp<i>) of a high level, and if the delayed clock signal (clk_dly<i>) has a low level, the flip-flop FF outputs the phase comparison signal (phcmp<i>) of a low level.

Conversely, if the comparison control signal (cmpcnt) has a low level, since a signal having a high level can be output from the second XNR gate XNR2 when the input clock signal (clk_in) has a low level, the flip-flop FF can implement the operation for latching the output signal of the first XNR gate XNR1. At this time, if the delayed clock signal (clk_dly<i>) has a low level, the flip-flop FF can output the phase comparison signal (phcmp<i>) of a high level, and if the delayed clock signal (clk_dly<i>) has a high level, the flip-flop FF can output the phase comparison signal (phcmp<i>) of a low level.

Namely, each phase comparator 212 can determine whether the input clock signal (clk_in) and the corresponding delayed clock signal (clk_dly<i>) have the same phase. Consequently, which signal among the n phase comparison signals (phcmp<1:*n*>) has a low level is used as a point of reference for the length information of the high duration and the low duration of the input clock signal (clk_in).

Figure 5:
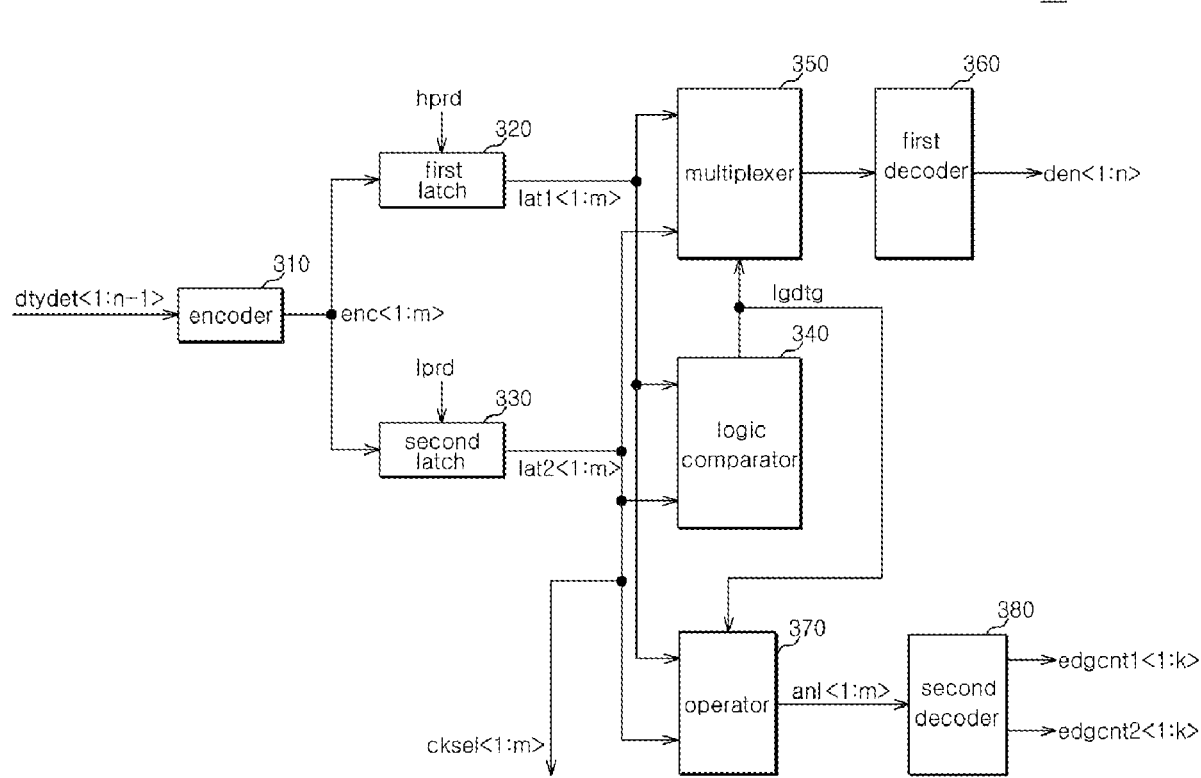
FIG. 5 is a block diagram of a signal analyzing unit that can be included in the circuit illustrated in FIG. 1.

FIG. 5 is a block diagram of a signal analyzing unit that can be included in the circuit illustrated in FIG. 1. Referring to FIG. 5, the signal analyzing unit 30 can include an encoder 310, a first latch 320, a second latch 330, a logic comparator 340, a multiplexer 350, a first decoder 360, an operator 370, and a second decoder 380.

The encoder 310 can encode the n−1 bit duty detection signals (dtydet<1:*n*−1>), and generate m-bit encoding signals (enc<1:*m*>).

The first latch 320 can latch the m-bit encoding signals (enc<1:*m*>) in response to the high duration signal (hprd), and output m-bit first latch signals (lat1<1:*m*>).

The second latch 330 can latch the m-bit encoding signals (enc<1:*m*>) in response to the low duration signal (lprd), and output m-bit second latch signals (lat2<1:*m*>).

The logic comparator 340 can compare the logic values of the m-bit first latch signals (lat1<1:*m*>) and the m-bit second latch signals (lat2<1:*m*>), and generate a logic determination signal (lgdtg).

The multiplexer 350 extracts signals having greater logic values between the first latch signals (lat1<1:*m*>) and the second latch signals (lat2<1:*m*>), in response to the logic determination signal (lgdtg).

The first decoder 360 can decode the signals transmitted from the multiplexer 350, and output the n-bit delay enable signals (den<1:*n*>).

The operator 370 can implement the operation for obtaining the logic differences between the first latch signals (lat1<1:*m*>) and the second latch signals (lat2<1:*m*>) in response to the logic determination signal (lgdtg), and generate operation signals (anl<1:*m*>).

The second decoder 380 can decode the operation signals (anl<1:*m*>), and generate the first edge control signals (edgcnt1<1:*k*>) and the second edge control signals (edgcnt2<1:*k*>).

Here, the high duration signal (hprd) can be a signal enabled during the high duration of the input clock signal (clk_in). Also, the low duration signal (lprd) can be a signal enabled during the low duration of the input clock signal (clk_in). The high duration signal (hprd) and the low duration signal (lprd) can be controlled in their enable durations such that each of them is enabled one time in each period of the input clock signal (clk_in).

The encoder 310 can determine which signal among the n−1 bit duty detection signals (dtydet<1:*n*−1>) has a high level and converts two times the length information of the high duration and the low duration of the input clock signal (clk_in) into the m-bit encoding signals (enc<1:*m*>). When the m-bit encoding signals (enc<1:*m*>) represent the information of the high duration of the input clock signal (clk_in), the high duration signal (hprd) is enabled, and the m-bit encoding signals (enc<1:*m*>) can be stored in the first latch 320. Further, when the m-bit encoding signals (enc<1:*m*>) represent the information of the low duration of the input clock signal (clk_in), the low duration signal (lprd) can be enabled, and the m-bit encoding signals (enc<1:*m*>) can be stored in the second latch 330.

The second latch signals (lat2<1:*m*>) output from the second latch 330 can be used as the clock selection signals (cksel<1:*m*>). The reason for this is that, since the clock selection unit 40 (see FIG. 1) inverts the clock signal among the n delayed clock signals (clk_dly<1:$n$>), which is delayed by the length of the low duration of the input clock signal (clk_in), and outputs it as the selected delayed clock signal (clk_sdly), the clock selection unit 40 needs the length information of the low duration of the input clock signal (clk_in) transmitted from the second latch signals (lat2<1:$m$>).

Then, the logic comparator 340 can generate the logic determination signal (lgdtg), which contains the information obtained by determining the logic values of the first latch signals (lat1<1:$m$>), and the second latch signals (lat2<1:$m$>). Meanwhile, the multiplexer 350 can output a signal having a greater logic value in response to the logic determination signal (lgdtg). The first decoder 360 can decode the output signal of the multiplexer 350 and generate the n-bit delay enable signals (den<1:$n$>). In this way, the n-bit delay enable signals (den<1:$n$>) can contain the information of an duration between the high duration and the low duration of the input clock signal (clk_in), which can have a greater length, and the number of bits to be enabled is determined depending upon the ratio between the high duration and the low duration. Therefore, by appropriately adjusting the number of the unit delays UD<1:$n$> of the clock dividing unit 10 (see FIG. 1) to be enabled, power consumption can be reduced.

The operator 370 can output the operation signals (anl<1:$m$>), which can have the logic values obtained by implementing subtraction between signals having greater logic values and signals having smaller logic values in the first latch signals (lat1<1:$m$>) and the second latch signals (lat2<1:$m$>). The magnitudes of the logic values of the first latch signals (lat1<1:$m$>) and the second latch signals (lat2<1:$m$>) can be determined by the logic determination signal (lgdtg). Then, the second decoder 380 can decode the operation signals (anl<1:$m$>) and generate the first and second edge control signals (edgcnt1<1:$k$>) and (edgcnt2<1:$k$>). At this time, the first and second edge control signals (edgcnt1<1:$k$>) and (edgcnt2<1:$k$>) can be signals that have opposite phases. The first and second edge control signals (edgcnt1<1:$k$>) and (edgcnt2<1:$k$>), which contain the information regarding the difference between the lengths of the high duration and the low duration of the input clock signal (clk_in), are transmitted to the edge control unit 70 (see FIG. 1) and are used in operation for reducing the difference between the lengths of the high duration and the low duration of the input clock signal (clk_in).

Figure 6:
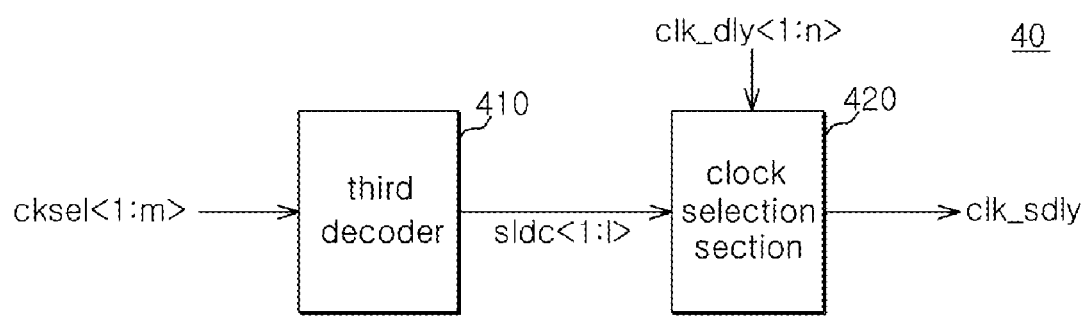
FIG. 6 is a block diagram of a clock selection unit that can be included in the circuit illustrated in FIG. 1.

FIG. 6 is a block diagram of a clock selection unit that can be included in the circuit illustrated in FIG. 1. Referring to FIG. 6, the clock selection unit 40 can include a third decoder 410 and a clock selection section 420. The third decoder 410 can decodes the clock selection signals (cksel<1:$m$>) and generate selection decoding signals (sldc<1:$l$>).

The clock selection section 420 can output any one among the n delayed clock signals (clk_dly<1:$n$>) as the selected delayed clock signal (clk_sdly) in response to the selection decoding signals (sldc<1:$l$>).

The selection decoding signals (sldc<1:$l$>) can be realized such that any one among l signals are enabled. The clock selection section 420 can be realized as a switch that inverts and outputs one delayed clock signal (clk_dly<i>) corresponding to the one signal enabled among the selection decoding signals (sldc<1:$l$>).

Figure 7:
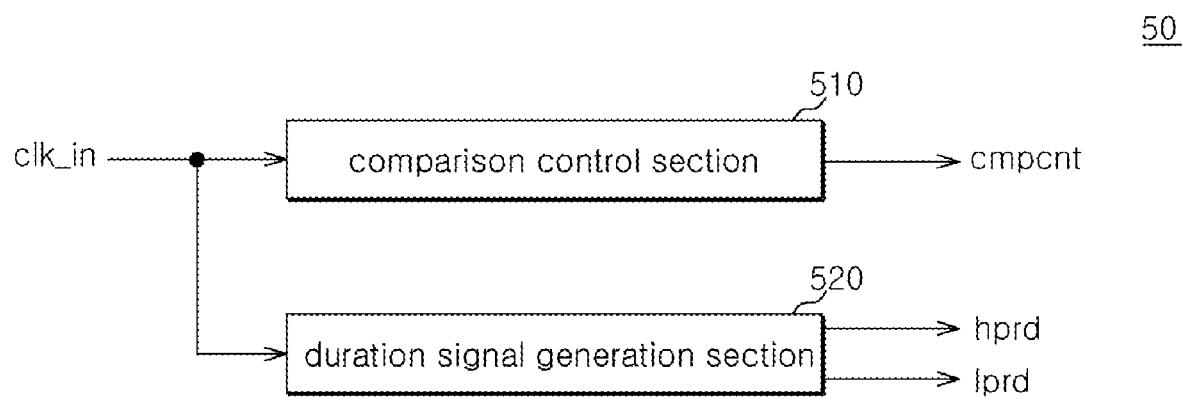
FIG. 7 is a block diagram of a control signal generation unit that can be included in the circuit illustrated in FIG. 1.

FIG. 7 is a block diagram of a control signal generation unit that can be included in the circuit illustrated in FIG. 1. Referring to FIG. 7, the control signal generation unit 50 can include a comparison control section 510 and an duration signal generation section 520.

The comparison control section 510 can frequency-divide by a specified number the input clock signal (clk_in) and generate the comparison control signal (cmpcnt). The duration signal generation section 520 can generate the high duration signal (hprd), which can be enabled during the high duration of the input clock signal (clk_in), and the low duration signal (lprd), which can be enabled during the low duration of the input clock signal (clk_in).

While the first edge control unit 710 and the second edge control unit 720 (see FIG. 1) are configured in the same manner, they can have different input signals, control signals and resultant output signals. In one embodiment, in the first edge control unit 710 and the second edge control unit 720, the input signals can be respectively the selected delayed clock signal (clk_sdly) and the delayed input clock signal (clk_din), the control signals can be respectively the first edge control signals (edgcnt1<1:$k$>) and the second edge control signals (edgcnt2<1:$k$>), and the output signals can be respectively the falling clock signal (fclk) and the rising clock signal (rclk). In this regard, in order to avoid repeated explanation, only the detailed description of the first edge control unit 710 will be given, and the detailed description of the second edge control unit 720 will be omitted herein.

Figure 8:
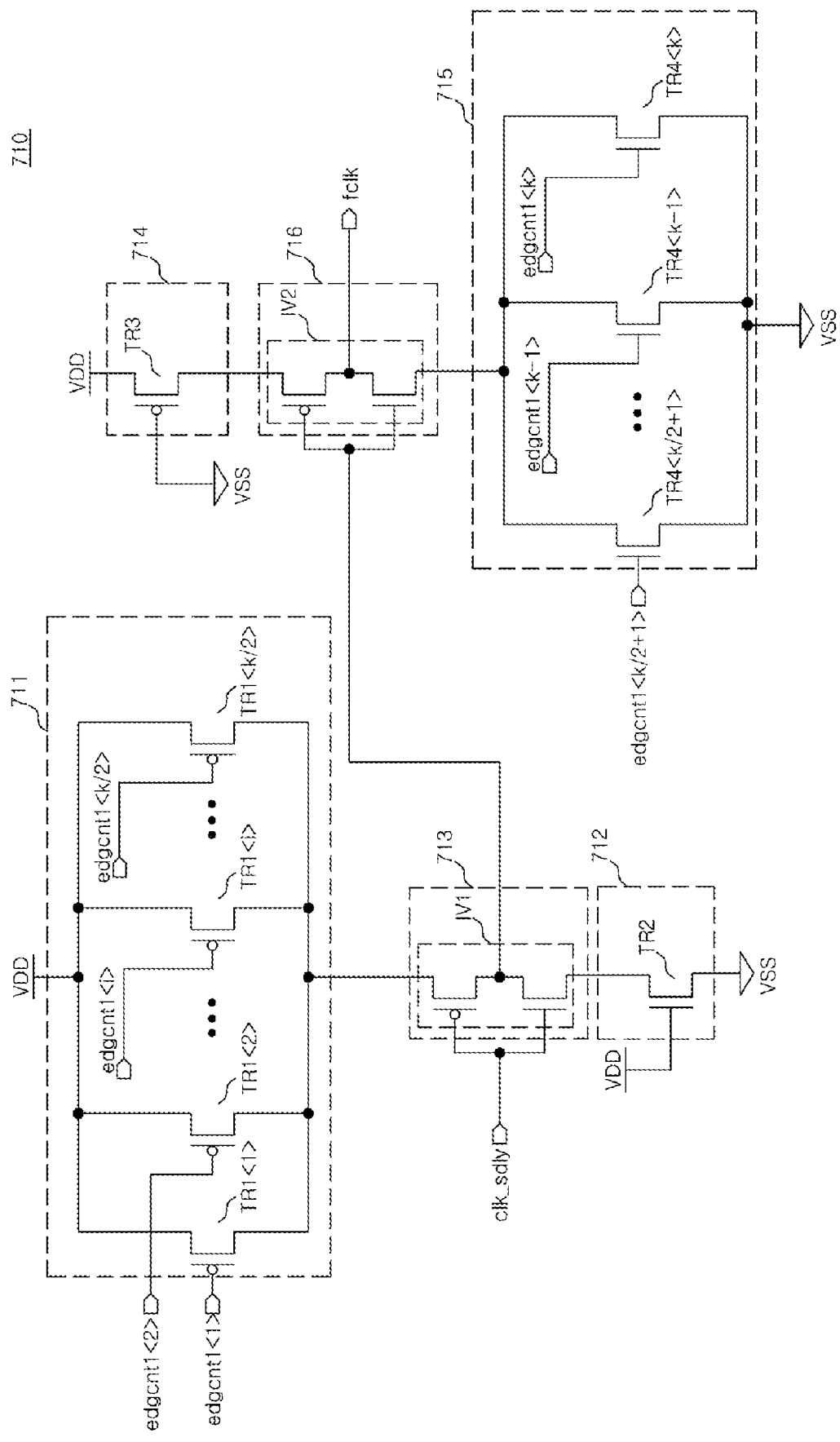
FIG. 8 is a block diagram of a first edge control unit that can be included in the circuit illustrated in FIG. 1.

FIG. 8 is a block diagram of a first edge control unit that can be included in the circuit illustrated in FIG. 1. Referring to FIG. 8, the first edge control unit 710 can include a first pull-up section 711, a first pull-down section 712, a first driving section 713, a second pull-up section 714, a second pull-down section 715, and a second driving section 716.

The first pull-up section 711 can pull up the output signal of the first driving section 713 in response to the first edge control signals (edgcnt1<1:$k$>). The first pull-down section 712 can pull down the output signal of the first driving section 713 in response to an externally supplied voltage 'VDD'.

The first driving section 713 can receive the selected delayed clock signal (clk_sdly), and respond to the pull-up operation of the first pull-up section 711 and the pull-down operation of the first pull-down section 712.

The second pull-up section 714 can pull up the output signal of the second driving section 716 in response to a ground voltage 'VSS'.

The second pull-down section 715 can pull down the output signal of the second driving section 716 in response to the first edge control signals (edgcnt1<1:$k$>).

The second driving section 716 can receive the output signal of the first driving section 713, respond to the pull-up operation of the second pull-up section 714 and the pull-down operation of the second pull-down section 715, and output the falling clock signal (fclk).

The first pull-up section 711 can be input with k/2 first edge control signals (edgcnt1<1:$k/2$>) among the k first edge control signals (edgcnt1<1:$k$>) through the respective gate terminals thereof. The first pull-up section 711 can include k/2 first transistors TR1<1:$k/2$>, which are arranged in parallel between the supply terminal of the externally supplied voltage 'VDD' and the first driving section 713.

The first pull-down section 712 can be input with the externally supplied voltage 'VDD' through the gate terminal thereof. The first pull-down section 712 can include a second transistor TR2, which is arranged between the first driving section 713 and the ground terminal.

The first driving section 713 can be applied with the voltages supplied from the first pull-up section 711 and the first pull-down section 712. The first driving section 713 can include a first inverter IV1, which can receive the selected delayed clock signal (clk_sdly).

The gate terminal of the second pull-up section 714 can be applied with the ground voltage 'VSS'. The second pull-up section 714 can include a third transistor TR3, can be arranged between the supply terminal of the externally supplied voltage 'VDD' and the second driving section 716.

The gate terminals of the second pull-down section 715 can be input with the first edge control signals (edgcnt1<k/2+1:k>) among the k-bit first edge control signals (edgcnt1<1:k>), which remain by excluding the first edge control signals (edgcnt1<1:k/2>) inputted to the first pull-up section 711. The second pull-down section 715 can include k/2 fourth transistors TR4<k/2+1:k>, which can be arranged in parallel between the supply terminal of the ground voltage 'VSS' and the second driving section 716.

The second driving section 716 can be applied with the voltages supplied from the second pull-up section 714 and the second pull-down section 715. The second driving section 716 can include a second inverter IV2, can receive the signal transmitted from the first driving section 713 and can output the falling clock signal (fclk).

When the number of low level signals among the signals (edgcnt1<1:k/2>) inputted to the first pull-up section 711 increases, the amount of the voltage, which the second pull-down section 715 applies to the second driving section 716, can increase. Accordingly, the low duration of the output signal of the second driving section 716, that is, the falling clock signal (fclk), can be widened.

When the number of high level signals among the signals (edgcnt1<k/2+1:k>) inputted to the second pull-down section 715 increases, the amount of the voltage, which the first pull-up section 711 applies to the first driving section 713, increases. Accordingly, the low duration of the output signal of the second driving section 716, that is, the falling clock signal (fclk), can be widened.

Thus, the first edge control signals (edgcnt1<1:k>) can serve as signals, which have appropriate logic values for decreasing the difference between the lengths of the high duration and the low duration of the input clock signal (clk_in). The first edge control unit 710 can implement operations in a manner such that, by controlling the falling edge of the selected delayed clock signal (clk_sdly) through controlling the driving force of the first pull-up section 711 and the second pull-down section 715, the duty ratio of the falling clock signal (fclk) can approach 50:50.

Similarly, the second edge control unit 720 can implement operations in a manner such that, by controlling the falling edge of the delayed input clock signal (clk_din) using the second edge control signals (edgcnt2), the duty ratio of the rising clock signal (rclk) can approach 50:50.

The phase mixing unit 80 can use these clock signals controlled in their duty ratios, and therefore, can implement more efficient phase mixing operation. Therefore, it is possible to precisely correct the duty ratio of the output clock signal (clk_out).

Figure 9A:
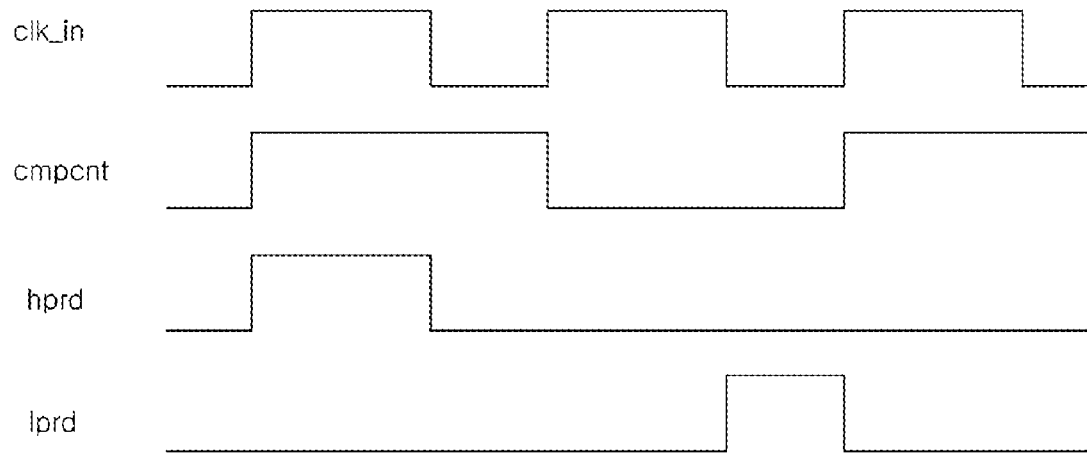
FIGS. 9a and 9b are waveform diagrams illustrating the operation of the duty cycle correction circuit illustrated in FIG. 1.
Figure 9B:
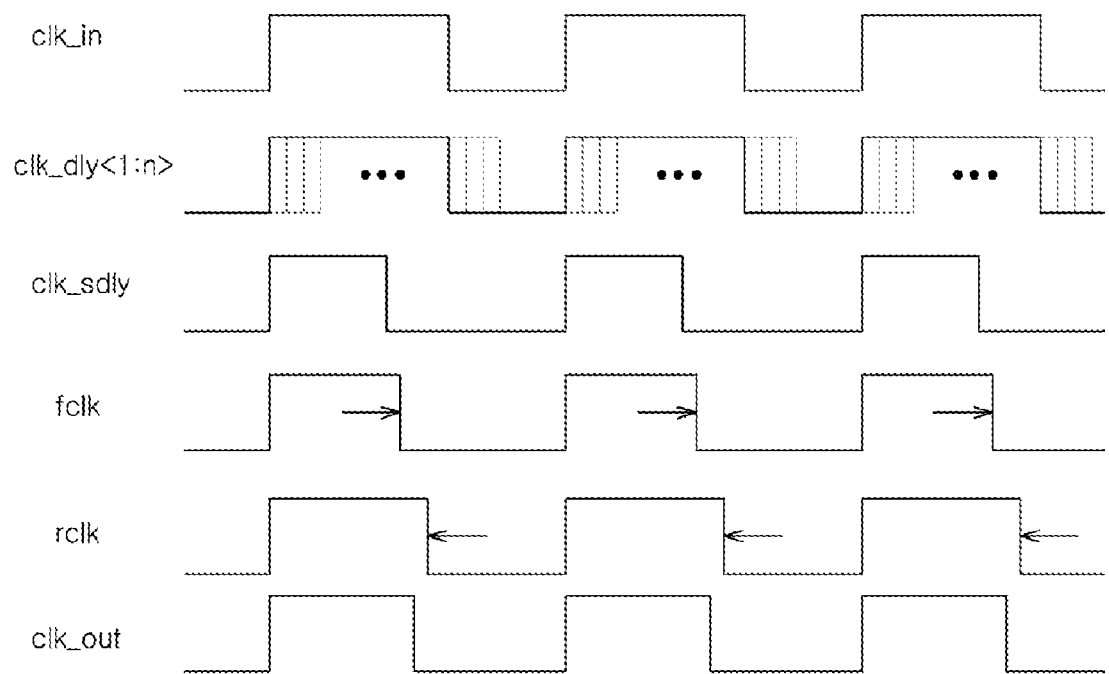

FIGS. 9a and 9b are waveform diagrams illustrating the operation of the duty cycle correction circuit in accordance with embodiments described herein. Referring to FIG. 9a, the waveforms of the input clock signal (clk_in), the comparison control signal (cmpcnt), the high duration signal (hprd), and the low duration signal (lprd) are illustrated. The input clock signal (clk_in) can have a high duration, which is wider than a low duration. The comparison control signal (cmpcnt) is represented as the clock signal can be obtained by frequency-dividing by 2 the input clock signal (clk_in). It is to be understood that the high duration signal (hprd) and the low duration signal (lprd) can be generated using the input clock signal (clk_in) and the comparison control signal (cmpcnt).

Referring to FIG. 9b, the waveforms of the n delayed clock signals (clk_dly<1:n>), the selected delayed clock signal (clk_sdly), the falling clock signal (fclk), the rising clock signal (rclk), and the output clock signal (clk_out) are illustrated. The selected delayed clock signal (clk_sdly) can be generated by inverting the clock signal among the n delayed clock signals (clk_dly<1:n>), of which falling edge can correspond to the rising edge of the input clock signal (clk_in). The falling clock signal (fclk) can be generated by controlling the falling edge of the selected delayed clock signal (clk_sdly), and the rising clock signal (rclk) can be generated by controlling the falling edge of the input clock signal (clk_in). The output clock signal (clk_out) is a clock signal, which is generated through implementing the operation of mixing the phases of the rising clock signal (rclk) and the falling clock signal (fclk).

As is apparent from the above description, in the duty cycle correction circuit according to the present invention, a plurality of delayed clock signals can be generated by delaying an input clock signal by a specified delay amount. Then, by comparing the input clock signal with the respective delayed clock signals, the length information of the high duration and the low duration of the input clock signal can be extracted. Any one among the plurality of delayed clock signals can be selected based on the length information of the high duration and the low duration of the input clock signal, and the falling edge timing of the selected clock signal can be controlled in accordance with the information of the difference between the lengths of the high duration and the low duration of the input clock signal. Also, the falling edge timing of the input clock signal can be controlled in accordance with the information of the difference between the lengths of the high duration and the low duration of the input clock signal. Then, by repeatedly implementing the operation for mixing the phases of the two clock signals controlled in their falling edge timing and thereby generating an output clock signal having a duty ratio approaching 50:50, the duty cycle correction operation can be completed. In this way, in the duty cycle correction circuit according to one embodiment described herein, the duty ratio correction operation can be primarily implemented by controlling the falling edges of the clock signals generated using the input clock signal and the duty ratio information, and thereupon, by mixing the phases of the two clock signals, further duty cycle correction operation can be precisely implemented. Furthermore, since only some unit delays are employed depending upon the length information of the high duration and the low duration of the input clock signal, power consumption can also be reduced.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A circuit for correcting a duty cycle, comprising:
a duty ratio digital conversion block configured to output duty ratio information of an input clock signal as plural-bit digital signals;
a duty ratio information analyzing block configured to analyze the duty ratio information of the input clock signal, generate edge control signals, and select any one of a plurality of delayed clock signals; and a duty ratio control block configured to control duty ratios of a selected delayed clock signal and the input clock signal in response to the edge control signals.

2. The circuit according to claim 1, wherein the duty ratio digital conversion block comprises:
a clock dividing unit configured to delay the input clock signal by a specified delay amount and generate the plurality of delayed clock signals; and
a duty ratio detection unit configured to comprise phases of the input clock signal and the respective delayed clock signals in response to a comparison control signal and generate duty detection signals as the plural-bit digital signals.

3. The circuit according to claim 1, wherein the duty ratio information analyzing block comprises:
a signal analyzing unit configured to generate plural-bit clock selection signals and the edge control signals from the plural-bit digital signals in response to a high duration signal and a low duration signal; and
a clock selection unit configured to select any one among the plurality of delayed clock signals in response to the plural-bit clock selection signals.

4. The circuit according to claim 1, wherein the duty ratio control block comprises:
an edge control unit configured to control edge timing of the selected delayed clock signal and the input clock signal in response to the edge control signals and generate a falling clock signal and a rising clock signal; and
a phase mixing unit configured to mix phases of the falling clock signal and the rising clock signal and generate an output clock signal.

5. The circuit according to claim 2, further comprising:
a control signal generating unit configured to generate the comparison control signal by frequency-dividing the input clock signal and generate the high duration signal and the low duration signal by determining a high duration and a low duration of the input clock signal.

6. A circuit for correcting a duty cycle, comprising:
a duty ratio detection unit configured to detect a duty ratio of an input clock signal and generate duty detection signals, which contain length information of a high duration and length information of a low duration of the input clock signal;
a signal analyzing unit configured to analyze the duty detection signals and generating first and second edge control signals;
an edge control unit configured to generate a falling clock signal by controlling an edge of a clock signal, which is delayed by a specified delay amount from the input clock signal and a rising clock signal by controlling an edge of the input clock signal, in response to the first and second edge control signals; and
a phase mixing unit configured to mix phases of the falling clock signal and the rising clock signal and generating an output clock signal.

7. The circuit according to claim 6, further comprising:
a control signal generation unit for generating a comparison control signal by frequency-dividing the input clock signal and for generating a high duration signal and a low duration signal by determining the high duration and the low duration of the input clock signal.

8. The circuit according to claim 7, wherein the control signal generation unit comprises:
a comparison control section for frequency-dividing by a predetermined number the input clock signal and generating the comparison control signal; and
a duration signal generation section for generating the high duration signal, which is enabled during the high duration of the input clock signal and the low duration signal, which is enabled during the low duration of the input clock signal.

9. The circuit according to claim 7, wherein the duty ratio detection unit comprises:
a phase comparison section configured to compare phases of the input clock signal and a plurality of delayed clock signals in response to the comparison control signal and generate a plurality of phase comparison signals; and
a signal combining section configured to combine the plurality of phase comparison signals and generate the plural-bit duty detection signals.

10. The circuit according to claim 9, wherein the phase comparison section comprises a plurality of phase comparators each of which extracts the same phase duration of the input clock signal and a previously allocated delayed clock signal among the plurality of delayed clock signals in response to the comparison control signal and generates a corresponding phase comparison signal.

11. The circuit according to claim 6, wherein the signal analyzing unit comprises:
an encoder configured to encode the plural-bit duty detection signals and generate plural-bit encoding signals;
a first latch for latching the plural-bit encoding signals in response to the high duration signal and outputting plural-bit first latch signals;
a second latch configured to latch the plural-bit encoding signals in response to the low duration signal and output plural-bit second latch signals;
a logic comparator configured to compare logic values of the plural-bit first latch signals and the plural-bit second latch signals and generate a logic determination signal;
an operator configured to implement operation for obtaining logic differences between the first latch signals and the second latch signals in response to the logic determination signal and generate operation signals; and
a first decoder configured to decode the operation signals and generating the first edge control signals and the second edge control signals.

12. The circuit according to claim 11, wherein the encoder determines which signal among the plural-bit duty detection signals has a first level and converts two times the length information of the high duration and the low duration of the input clock signal into the plural-bit encoding signals.

13. The circuit according to claim 11, wherein the operator generates the operation signals, which have logic values obtained by implementing subtraction between signals having greater logic values and signals having smaller logic values in the first latch signals and the second latch signals.

14. The circuit according to claim 6, wherein the edge control unit comprises:
a first edge control unit configured to generate the falling clock signal by controlling the edge of the clock signal, which is delayed from the input clock signal, in response to the first edge control signals; and
a second edge control unit configured to generate the rising clock signal by controlling the edge of the input clock signal, in response to the second edge control signals.

15. The circuit according to claim 14, wherein the first edge control unit comprises:
a first pull-up section configured to pull up a first driving section in response to the first edge control signals;
a first pull-down section configured to pull down the first driving section in response to an externally supplied voltage;

the first driving section configured to receive the clock signal delayed from the input clock signal and respond to pull-up operation of the first pull-up section and pull-down operation of the first pull-down section;

a second pull-up section configured to pull up a second driving section in response to a ground voltage;

a second pull-down section configured to pull down the second driving section in response to the first edge control signals; and the second driving section configured to receive an output signal of the first driving section, responding to pull-up operation of the second pull-up section and pull-down operation of the second pull-down section, and output the falling clock signal.

16. The circuit according to claim 14, wherein the second edge control unit comprises:

a first pull-up section configured to pull up a first driving section in response to the second edge control signals;

a first pull-down section configured to pull down the first driving section in response to an externally supplied voltage;

the first driving section configured to receive the input clock signal and responding to pull-up operation of the first pull-up section and pull-down operation of the first pull-down section;

a second pull-up section configured to pull up a second driving section in response to a ground voltage;

a second pull-down section configured to pull down the second driving section in response to the second edge control signals; and the second driving section configured to receive an output signal of the first driving section, responding to pull-up operation of the second pull-up section and pull-down operation of the second pull-down section, and outputting the rising clock signal.

17. The circuit according to claim 11, wherein the signal analyzing unit further comprises:

a multiplexer configured to extract signals having greater logic values between the first latch signals and the second latch signals, in response to the logic determination signal; and a second decoder configured to decode signals transmitted from the multiplexer and outputting plural-bit delay enable signals.

18. The circuit according to claim 17, r comprising:

a clock dividing unit configured to delay the input clock signal by a specified delay amount in response to the plural-bit delay enable signals and generate a plurality of delayed clock signals; and a clock selection unit configured to invert and output any one among the plurality of delayed clock signals, in response to plural-bit clock selection signals.

19. The circuit according to claim 18, wherein the clock dividing unit comprises a plurality of unit delays, which sequentially delay the input clock signal in response to previously allocated signals among the plural-bit delay enable signals and generate the plurality of delayed clock signals.

20. The circuit according to claim 18, wherein the clock selection unit comprises:

a third decoder configured to decode the clock selection signals and generate selection decoding signals; and a clock selection section configured to invert and output any one among the plurality of delayed clock signals, in response to the selection decoding signals.

21. A method for correcting a duty cycle, comprising the steps of:

delaying an input clock signal by a specified delay amount and generating a plurality of delayed clock signals;

comparing phases of the input clock signal and the respective delayed clock signals and converting duty ratio information of the input clock signal into plural-bit digital signals;

analyzing the duty ratio information of the input clock signal and generating clock selection signals and edge control signals;

selecting any one among the plurality of delayed clock signals in response to the clock selection signals; and controlling duty ratios of the selected delayed clock signal and the input clock signal in response to the edge control signals.

22. The method according to claim 21, wherein comparing phases of input clock signal and the respective delayed clock signals comprises the steps of:

comparing phases of the input clock signal and the plurality of delayed clock signals in response to a comparison control signal and generating a plurality of phase comparison signals; and combining the plurality of phase comparison signals and generating duty detection signals as the plural-bit digital signals.

23. The method according to claim 21, wherein analyzing the duty ratio information of the input clock signal comprises the steps of:

encoding the plural-bit duty detection signals and generating plural-bit encoding signals;

latching the plural-bit encoding signals during a high duration of the input clock signal and outputting plural-bit first latch signals;

latching the plural-bit encoding signals during a low duration of the input clock signal and outputting the plural-bit clock selection signals;

comparing logic values of the plural-bit first latch signals and the plural-bit clock selection signals and generating a logic determination signal;

operating for obtaining logic differences between the first latch signals and the clock selection signals in response to the logic determination signal and generating operation signals; and decoding the operation signals and generating the edge control signals.

24. The method according to claim 21, wherein selecting any one among the plurality of delayed clock signals comprises the steps of:

decoding the clock selection signals and generating the selection decoding signals; and selecting any one among the plurality of delayed clock signals in response to the selection decoding signals.

25. The method according to claim 21, wherein controlling duty ratios of the selected delayed clock signal and the input clock signal comprises the steps of:

controlling falling edges of the selected delayed clock signal and the input clock signal in response to the edge control signals and generating a falling clock signal and a rising clock signal; and mixing phases of the falling clock signal and the rising clock signal and generating an output clock signal.

* * * * *